United States Patent [19]

Okamoto

[11] Patent Number: 4,679,062
[45] Date of Patent: Jul. 7, 1987

[54] THIN FILM TRANSISTOR

[75] Inventor: Kotaro Okamoto, Hino, Japan

[73] Assignee: Hosiden Electronics Co., Ltd., Osaka, Japan

[21] Appl. No.: 809,677

[22] Filed: Dec. 16, 1985

[30] Foreign Application Priority Data

Dec. 28, 1984 [JP] Japan ................... 59-279986

[51] Int. Cl.$^4$ ............................................ H01L 29/80
[52] U.S. Cl. .......................................... 357/22; 357/2; 357/15; 357/55; 357/63; 357/59
[58] Field of Search .................... 357/2, 15, 22, 55, 59, 357/63

[56] References Cited

U.S. PATENT DOCUMENTS 4,489,149 12/1984 Kawamura et al. ................ 357/2
4,532,536  7/1985 Hatanaka ............................ 357/2
4,558,340 12/1985 Schachter et al. ................... 357/2

Primary Examiner—Edward J. Wojciechowicz
Attorney, Agent, or Firm—Pollock, VandeSande and Priddy

[57] ABSTRACT

An impurity-doped amorphous silicon semiconductor layer is deposited on a substrate, source and drain electrodes are deposited apart from each other on the amorphous silicon semiconductor layer in ohmic contact therewith and a gate electrode is deposited on the amorphous silicon semiconductor layer in Schottky contact therewith between the source and drain electrodes, thereby forming a thin film transistor.

7 Claims, 5 Drawing Figures

THIN FILM TRANSISTOR

BACKGROUND OF THE INVENTION

The present invention relates to a thin film transistor which is suitable for use, for instance, as an active element of a drive circuit for a liquid crystal display cell, and more particularly to a thin film transistor with an amorphous semiconductor layer which is preferable for use as an active element of a drive circuit for selective switching control of display electrodes of the liquid crystal cell.

Heretofore there has been proposed an active matrix liquid crystal display of the type that has display electrodes arranged in a matrix form and selectively applies thereto voltage to reproduce and display television signals as images. In this instance, thin film transistors are employed for the selective voltage application to the display electrodes of the liquid crystal display cell and drive circuits for driving gate buses and source buses connected to gates and sources of the thin film transistors, respectively, are provided on one of transparent substrates of the liquid crystal display cell. Such an arrangement is proposed in U.S. patent application Ser. No. 510,481 "Dot-Matrix Liquid Crystal Display" filed on July 1, 1983 corresponding to Japanese Patent Application No. 120,808/82 (Pat. Pub. Disc. No. 10,988/84), "Liquid Crystal Color Display", for reducing the number of external leads (terminals) and for facilitating the connection of the liquid crystal display cell with an external device.

A brief description will be given first of this conventional liquid crystal display. As shown in FIG. 1, liquid crystal is sealed in the space defined by transparent substrates 11 and 12 to form a liquid crystal cell 13. In the liquid crystal cell 13 a number of display electrodes and thin film transistors connected thereto via drain electrodes, though not shown, are disposed, for example, in a matrix form on the transparent substrate 11. For each row of the thin film transistors their gate electrodes are connected to a gate bus 14 and for each column their source electrodes are connected to a source bus 15. The gate buses 14 and the source buses 15 are led out of the liquid crystal cell 13. The transparent substrate 11 has formed thereon a gate bus drive circuit 16 for selectively driving the gate buses 14 and a latch circuit (a source bus drive circuit) 17 which is connected to a shift register 18. Picture signals to be displayed are applied serially to the shift register 18 and latched in the latch circuit 17 in parallel. Parallel outputs of the latch circuit 17 are respectively provided on the corresponding source buses 15.

The provision of the gate drive circuit 16 and the latch circuit (the source drive circuit) 17 on the transparent substrate 11, for driving the thin film transistors in the liquid crystal cell 13, permits the reduction of the number of terminals for external connection, and hence is very convenient.

Conventionally the gate drive circuit 16, the latch circuit (the source drive circuit) 17 and the shift register 18 are each formed using an MOSFET, i.e. an FET which has its gate electrode formed on a semiconductor layer between the source and drain through a gate insulating film. On account of this gate insulating film, the MOSFET is low in the operating speed as a switching element, calls for a relatively large drive current and is somewhat complex in structure, and hence is low in production yield and not suitable for fabrication with high integration density. Furthermore, the voltage to be applied is relatively high, that is, since the gate voltage is applied via the gate insulation film to the semiconductor layer, the voltage is divided by the gate insulating film and the voltage applied to the semiconductor layer becomes low, so that an appreciably high gate voltage is needed.

A metal-epitaxial-semiconductor thin film transistor (MESFET) of the type that has a GaAs epitaxial growth layer formed on a semi-insulating GaAs substrate and a metallic layer formed on the epitaxial layer in Schottky contact therewith and controls source-to-drain current by controlling a depletion layer is proposed, for instance, in Proc. IEEE, 54,307, 1966, C. A. Mead, "Schottky Barrier Gate Field-Effect Transistor" and Proc. IEEE, 55, 1237, 1967, W. W. Heuper et al., "An Epitaxial GaAs Field-Effect Transistor". Since the MESFET employs the epitaxial growth layer, it is difficult to use for a circuit which needs a large area, and this FET is expensive because of using GaAs.

SUMMARY OF THE INVENTION

It is therefore an object of the present invention to provide a thin film transistor which operates at high speed and can be easily used with a circuit of a large area and fabricated at a low cost.

According to the present invention, an impurity-doped amorphous semiconductor layer is used as the semiconductor layer. A source and a drain electrode are formed in spaced relation to one another on the amorphous semiconductor layer in ohmic contact therewith, and a gate electrode is formed on the amorphous semiconductor layer in Schottky contact therewith between the source and drain electrodes. That is, the thin film transistor of the present invention is an MESFET, and hence has no gate insulating film and is simple in structure as compared with the conventional MOSFET. Accordingly, its operating speed can be increased and its drive power can also be reduced. In addition, since the semiconductor layer is not single-crystal but amorphous, the thin film transistor can be formed over a wide area and with ease and at low cost.

DESCRIPTION OF THE PREFERRED EMBODIMENTS

Figure 1:
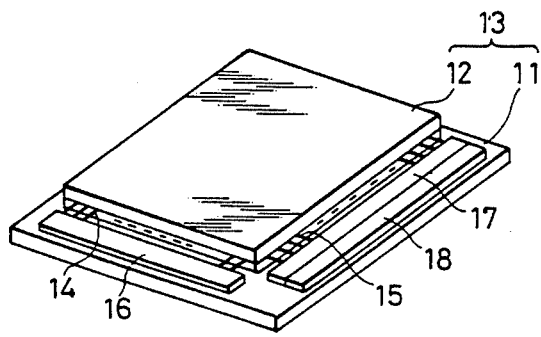
FIG. 1 is a perspective view showing the general construction of a conventional liquid crystal display cell with drive circuits mounted thereon.
Figure 2:
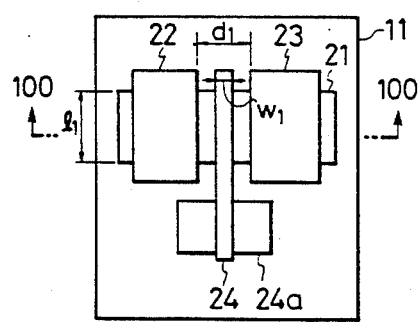
FIG. 2 is a plan view illustrating an example of the thin film transistor of the present invention.
Figure 3:
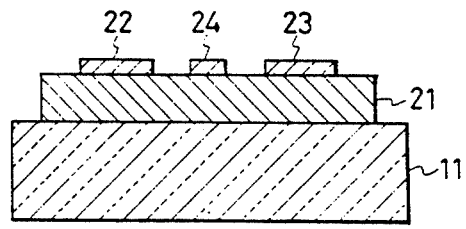
FIG. 3 is a sectional view taken on the line 100—100 in FIG. 2.

FIGS. 2 and 3 illustrate an example of the thin film transistor of the present invention, in which an n-type hydrogenated amorphous silicon layer (hereinafter sometimes simply referred to as amorphous silicon layer) 21 doped with phosphorus (P) is formed as an amorphous semiconductor layer on a transparent substrate 11 as of glass. The n-type amorphous silicon layer 21 can be formed, for example, by a plasma CVD (Chemical Vapor Deposition) process as follows: A gas mixture of argon and SiH4 is introduced into a reaction chamber, along with a small quantity of PH3 diluted with argon. The molar ratio of argon to SiH4 is always held at 11; the transparent substrate 11 is held at about 250° C.; the pressure in the reaction chamber is retained at 0.36 Torr; the frequency of RF power is 12.56 KHz; and the power is 40 W. The impurity concentration of phosphorus to silicon in the amorphous silicon layer 21 is selected substantially in the range of $0.75 \times 10^{-3}$ to $1.5 \times 10^{-3}$ in terms of molar ratio $M_{p/s}$. The amorphous silicon layer 21 is selectively removed by reactive atom-beam etching through an aluminum mask, leaving only active regions on the transparent substrate 11. The thickness of that portion of the amorphous silicon layer 21 in which the gate region will ultimately be formed is selected in the range of 0.1 to 1.0 μm, preferably, 0.3 to 0.5 μm in this example. The distance $d_1$ between drain and source electrodes 22 and 23 is, for example, 70 μm and the width $W_1$ and the length $l_1$ of a gate electrode 24 are 30 μm and 1.54 mm, respectively.

The drain electrode 22 and the source electrode 23 are formed apart from one another on the amorphous silicon layer 21 in ohmic contact therewith by means of vacuum evaporation of aluminum and photolithography. Between the drain and source electrodes 22 and 23 the gate electrode 24 is deposited in spaced relation thereto, for instance, by vacuum evaporation of gold and a lift-off process, on the amorphous silicon layer 21 in Schottky contact therewith. Incidentally, an electrode 24a for external connection of the gate electrode 24 is formed on the transparent electrode 11 simultaneously with the electrodes 22 and 23 and the gate electrode 24 is formed on the electrode 24a. The conductivity of the phosphorus-doped amorphous silicon layer 21 is selected to range from $10^{-4} \Omega cm^{-1}$ to 10 $\Omega cm^{-1}$.

When no voltage is applied to the gate electrode 24, the above n-type MESFET is conductive between the drain and source electrodes 22 and 23, that is, it is in the ON state. When voltage is applied to the gate electrode 24 and a depletion layer which is formed in the semiconductor layer 21 thereunder reaches the opposite side across the thickness of the semiconductor layer, the MESFET goes nonconductive between the drain and source electrodes 22 and 23. In this way, conduction and nonconduction between the electrodes 22 and 23 can be controlled with the voltage that is applied to the gate electrode 24.

Figure 4:
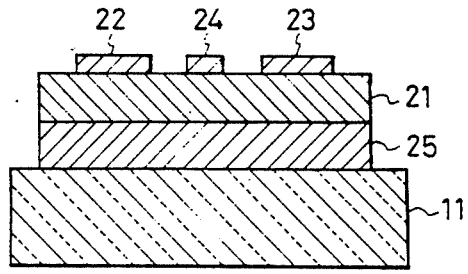
FIG. 4 is a sectional view corresponding to FIG. 3, illustrating another example of the thin film transistor of the present invention.

According to the present invention, it is also possible to employ such a structure as shown in FIG. 4. In this instance, a semiconductor layer 25 of hydrogenated amorphous silicon, not doped with an impurity, is deposited on the transparent substrate 11 and the semiconductor layer 21 of phosphorus-doped hydrogenated amorphous silicon is deposited on the semiconductor layer 25 and, further, the drain, source and gate electrodes 22, 23 and 24 are formed on the semiconductor layer 21 in the same manner as referred to above in respect of FIG. 2. With such a structure, it is possible to avert bad influences of ions and the like present in the boundary between the substrate 11 and the amorphous semiconductor layer 21, ensuring to obtain excellent characteristics.

Figure 5:
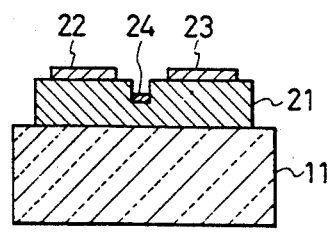
FIG. 5 is a sectional view corresponding to FIG. 3, illustrating another example of the thin film transistor of the present invention which employs a grooved-gate structure.

Also it is possible to cut a groove in the gate region of the semiconductor layer 21 so that only the gate region is smaller in thickness than the other regions, as shown in FIG. 5.

According to the experiments in which the impurity concentration in molar ratio of phosphorus to silicon was $1.5 \times 10^{-3}$, the structure shown in FIGS. 2 and 3 was used and the semiconductor layer 21 was 1 μm thick, the transferconductance gm of the MESFET was $10^{-7}$ mS/mm. When the semiconductor layer 21 was 0.45 μm thick, the transferconductance gm was $5.5 \times 10^{-6}$ mS/mm. In the case where the structure of FIG. 5 was used, the impurity concentration of the semiconductor layer 21 was $1.5 \times 10^{-3}$ and the gate region was 0.45 μm thick, the transferconductance gm was $1.3 \times 10^{-4}$ mS/mm. When the impurity concentration of the semiconductor layer 21 was $1.0 \times 10^{-4}$ and the gate region was 0.25 μm thick, the transferconductance gm was $1.0 \times 10^{-5}$ mS/mm. It will be understood from the above that the recessed structure depicted in FIG. 5 is lower in the ON resistance between the drain and source than the flat gate structure of FIG. 3 and hence is preferable for practical use.

The transferconductance gm increases with an increase in the impurity concentration of the semiconductor layer 21, but when the ratio of phosphorus to silicon was selected to be $2.0 \times 10^{-3}$ and $2.5 \times 10^{-3}$, excellent gate characteristics based on the Schottky characteristics could not be obtained. Accordingly, it is preferable that the impurity concentration be in the range of $1.0 \times 10^{-3}$ to $1.5 \times 10^{-3}$.

The semiconductor layer 21 may be formed of fluorinated amorphous silicon, amorphous silicon-germanium or like semiconductor compound, or amorphous silicon-tin or like compound semiconductor as well as hydrogenated amorphous silicon. When the amorphous semiconductor layer 21 is formed of the hydrogenated amorphous silicon, the gate electrode 24 for Schottky contact therewith may also be formed not only of gold but also of molybdenum or tungsten. Furthermore, the MESFET can be made normally-OFF by selecting the material of the gate electrode 24 and the conductivity and thickness of the amorphous semiconductor layer 21. For example, in the case of obtaining an N-channel enhancement type FET, the gate electrode 24 is formed of a metal which has a larger work function than amorphous silicon, such as titanium (Ti) or palladium (Pd), and the active layer is made thinner than in the case of the above-described depletion type FET. A P-channel FET can be obtained by forming the gate electrode of a metal which has a smaller work function than does the amorphous silicon, such as rubidium (Rb). In the case of employing such thin film transistors as a plurality of active elements in the liquid crystal display element drive circuit, the thin film transistors are formed on the same amorphous semiconductor layer 21 and, each is isolated from adjacent transistors in the same manner as in the case of a circuit employing conventional MESFETs of this kind.

As described above, the thin film transistor of the present invention is a metal-semiconductor contact type field effect transistor and is simple in structure. That is, the nonuse of the gate insulating film simplifies the manufacturing process, increases the production yield and makes the thin film transistor suitable for fabrication with a high integration density. Moreover, the absence of the gate insulating film eliminates the influence of its electrostatic capacitance, providing for increased switching speed. For example, in the case of the structure depicted in FIG. 5, when the impurity concentration of phosphorus relative to silicon, the thickness of the gate region and the transferconductance gm are $1.5 \times 10^{-3}$, 0.45 μm and $1.3 \times 10^{-4}$ mS/mm, respectively, the effective mobility is about 1.9 cm²/V.s. This is one digit order of magnitude higher than the effective mobility of the conventional MOSFET. Accordingly, the present invention permits the fabrication of an FET which operates at a speed about 10 times higher than the prior art MOSFET. Besides, the direct application of the gate voltage to the amorphous semiconductor layer 21 enables low-voltage operations.

Especially in the case where the drive circuits 16, 17 and shift register 18 on the transparent substrate of the liquid crystal display are formed by the MESFETs explained above, it is possible to increase the drive speed. Moreover, when the thin film switching transistors inside the liquid crystal cell are formed by the MESFETs of the same structure as of the drive circuits (including the shift register), these switching transistors and the drive circuits can be simultaneously prepared on the substrate through the common processes.

It will be apparent that many modifications and variations may be effected without departing from the scope of the novel concepts of the present invention.

What is claimed is:

1. A thin film transistor comprising:
   a substrate;
   an impurity-doped hydrogenated amorphous silicon semiconductor layer formed on the substrate;
   a source and drain electrode formed apart from one another on the amorphous silicon semiconductor layer in ohmic contact therewith;
   a gate electrode formed on the amorphous silicon semiconductor layer in Schottky contact therewith between the source and drain electrodes, the portion of said amorphous silicon semiconductor layer underlying the gate electrode being 0.1 to 1.0 μm thick; and
   an impurity-undoped amorphous silicon semiconductor layer interposed between the impurity-doped amorphous silicon semiconductor layer and the substrate.

2. A thin film transistor according to claim 1 wherein a groove is cut in the impurity-doped amorphous silicon semiconductor layer between the source and drain electrodes, the gate electrode is formed on the bottom of the groove, and that portion of the impurity-doped semiconductor layer underlying the gate electrode is thinner than those portions underlying the source and drain electrodes.

3. A thin film transistor for use as an active element of a drive circuit formed on a transparent substrate for driving switching elements to select picture element electrodes of an active matrix liquid crystal display cell, the thin film transistor comprising:
   an impurity-doped hydrogenated amorphous silicon semiconductor layer formed on the transparent substrate;
   a source and a drain electrode formed apart from one another on the amorphous silicon semiconductor layer in ohmic contact therewith;
   a gate electrode formed on the amorphous silicon semiconductor layer in Schottky contact therewith between the source and drain electrodes, that portion of the amorphous silicon layer underlying the gate electrode being 0.1 to 1.0 μm thick; and
   an impurity-undoped amorphous silicon semiconductor layer interposed between the impurity-doped amorphous silicon semiconductor layer and the substrate.

4. A thin film transistor according to claim 1 or claim 3 wherein the impurity concentration of the hydrogenated amorphous silicon layer is in the range of $0.75 \times 10^{-3}$ to $1.5 \times 10^{-3}$.

5. A thin film transistor according to claim 4 wherein the impurity doped in the hydrogenated amorphous silicon layer is phosphorus.

6. A thin film transistor according to claim 1 or claim 3 wherein that portion of the amorphous silicon semiconductor layer underlying the gate electrode is 0.3 to 0.5 μm thick.

7. A thin film transistor according to claim 1 or claim 3 wherein the gate electrode is formed of gold.

* * * * *